US011081428B2

(12) United States Patent
Chou et al.

(10) Patent No.: US 11,081,428 B2
(45) Date of Patent: Aug. 3, 2021

(54) ELECTRONIC DEVICE WITH THREE DIMENSIONAL THERMAL PAD

(71) Applicant: Texas Instruments Incorporated, Dallas, TX (US)

(72) Inventors: Stanley Chou, Taipei (TW); Yuh-Harng Chien, New Taipei (TW); Steven Alfred Kummerl, Carrollton, TX (US); Bo-Hsun Pan, Taoyuan (TW); Pi-Chiang Huang, New Taipei (TW); Frank Yu, New Taipei (TW); Chih-Chien Ho, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/537,535

(22) Filed: Aug. 10, 2019

(65) Prior Publication Data
US 2021/0043548 A1    Feb. 11, 2021

(51) Int. Cl.
*H01L 23/495* (2006.01)
*H01L 23/00* (2006.01)
*H01L 23/492* (2006.01)

(52) U.S. Cl.
CPC ...... *H01L 23/49503* (2013.01); *H01L 23/492* (2013.01); *H01L 23/49541* (2013.01); *H01L 23/49568* (2013.01); *H01L 24/30* (2013.01); *H01L 2924/181* (2013.01)

(58) Field of Classification Search
CPC ............. H01L 23/49503; H01L 23/492; H01L 23/49541; H01L 24/30; H01L 2924/181
See application file for complete search history.

(56) References Cited

U.S. PATENT DOCUMENTS

| 6,049,123 A * | 4/2000 | Burns .................. H01L 21/565 |
| | | 257/686 |
| 2006/0131734 A1 | 6/2006 | Kummerl et al. |
| 2006/0289971 A1 | 12/2006 | Lange et al. |
| 2010/0001382 A1 | 1/2010 | Udompanyavit et al. |
| 2013/0122654 A1 | 5/2013 | Ho et al. |
| 2017/0179007 A1 | 6/2017 | Chang et al. |

(Continued)

OTHER PUBLICATIONS

Moss, "What to consider when designing an automotive power supply," https://e2e.ti.com/blogs_/b/behind_the_wheel/archive/2016/06/27/what-makes-a-good-power-solution-for-an-automotive-design, (7 pages) (printed Jul. 24, 2019) (copyright date 1995-2019).

*Primary Examiner* — Zandra V Smith
*Assistant Examiner* — Andre C Stevenson
(74) *Attorney, Agent, or Firm* — Ronald O. Neerings; Charles A. Brill; Frank D. Cimino (57) ABSTRACT

An electronic device includes a package structure with opposite first and second sides spaced apart along a first direction, opposite third and fourth sides spaced apart along a second direction, opposite fifth and sixth sides spaced apart along a third direction, the first, second, and third directions being orthogonal to one another. A set of first leads extend outward from the first side along the first direction, a set of second leads extend outward from the second side along the first direction, and a thermal pad includes a first portion that extends along a portion of the fifth side, and a second portion that extends along a portion of the third side to facilitate cooling and visual solder inspection when soldered to a host printed circuit board.

22 Claims, 10 Drawing Sheets

(56) References Cited

U.S. PATENT DOCUMENTS

2017/0330841 A1  11/2017 Cook et al.
2018/0090419 A1   3/2018 Ho et al.
2018/0331067 A1* 11/2018 Williams .............. H01L 21/268

* cited by examiner

ELECTRONIC DEVICE WITH THREE DIMENSIONAL THERMAL PAD

BACKGROUND

Integrated circuits and other packaged electronic devices include pins or leads that can be soldered to a host printed circuit board (PCB) to electrically connect component terminals inside the device to other components or circuitry of the PCB. The leads are typically located along two or more sides of the device package. Thermal pads, sometimes referred to as power pads, can be located along the bottom of the electronic device package for soldering to conductive pads of the host PCB to draw heat away from the electronic device. The heat transfer performance can be limited by the size of the thermal pad, as well as by the quality of the solder connection to the host PCB. The bottom side of the device package, however, may be limited in terms of usable thermal pad area in view of any applicable isolation spacing requirements between a given thermal pad and other bottom side thermal pads and/or device leads. In addition, the quality of a solder joint or junction between a bottom side thermal pad and the associated PCB pad cannot be inspected visually or by camera because the solder junction is underneath the device package.

SUMMARY

An electronic device includes a package structure with opposite first and second sides spaced apart along a first direction, opposite third and fourth sides spaced apart along a second direction, opposite fifth and sixth sides spaced apart along a third direction, the first, second, and third directions being orthogonal to one another. A set of first leads extend outward from the first side along the first direction, a set of second leads extend outward from the second side along the first direction, and a thermal pad includes a first portion that extends along a portion of the fifth side, and a second portion that extends along a portion of the third side.

A lead frame includes a set of first leads that extend along a first direction, a set of second leads spaced apart from the first leads that extend along the first direction, and a thermal pad spaced apart from the first and second leads. The thermal pad includes a first portion that extends along a second direction and is coplanar with the first and second leads in a plane of the first and second directions. The thermal pad also includes a second portion that extends from an end of the first portion along a direction at a non-zero angle to the plane of the first and second directions.

A method includes providing a lead frame having a set of first leads extending along a first direction, a set of second leads extending along the first direction, a thermal pad spaced apart from the first and second leads, and a die attach pad. The thermal pad includes a first portion coplanar with the first and second leads and extending along a second direction orthogonal to the first direction, and a second portion extending from an end of the first portion along a direction at a non-zero angle to a plane of the first and second directions. The method further includes attaching a semiconductor die to the die attach pad of the lead frame, attaching bond wires between respective bond pads of the semiconductor die and at least some of the first and second leads of the lead frame, and enclosing the semiconductor die, a portion of the die attach pad, portions of the first and second leads, and parts of the first and second portions of the thermal pad, in a package structure that exposes parts of the first and second portions of the thermal pad.

DETAILED DESCRIPTION

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1:
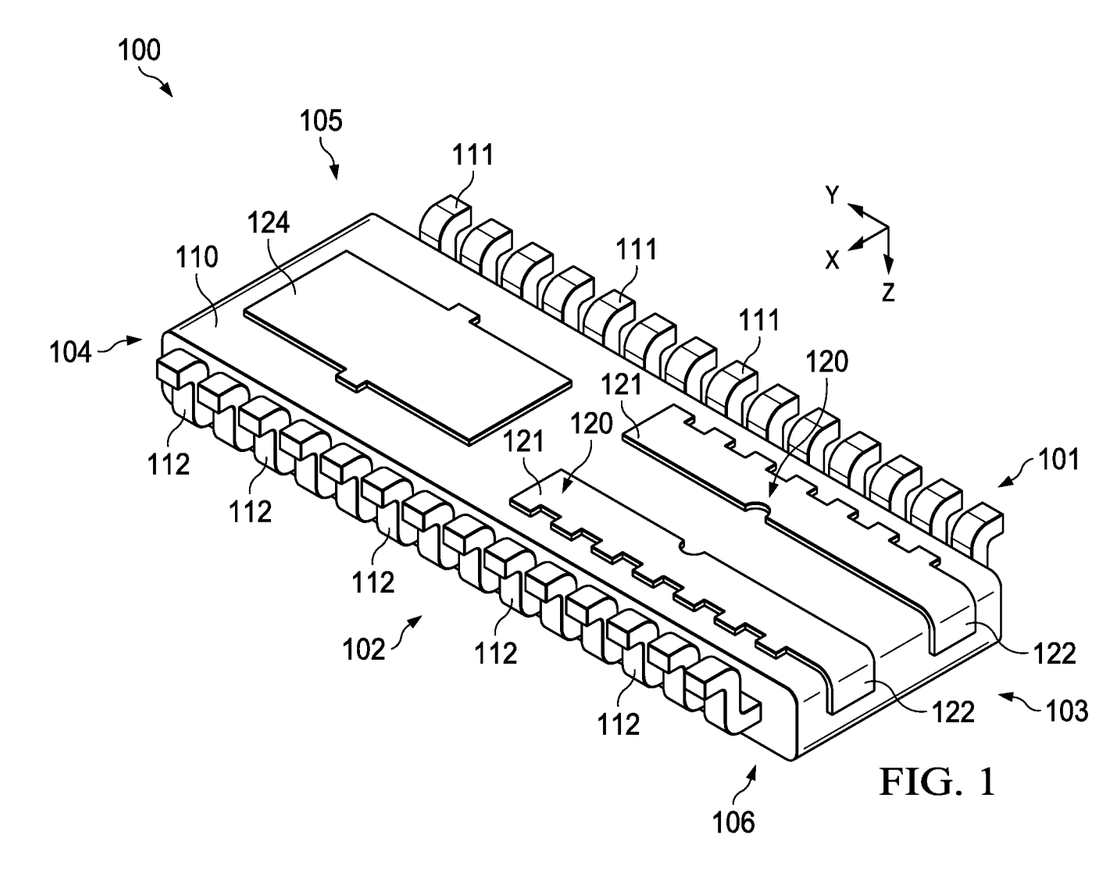
FIG. 1 is a bottom perspective view of an electronic device with three dimensional thermal pads extending on the bottom and end of a package structure.
Figure 2:
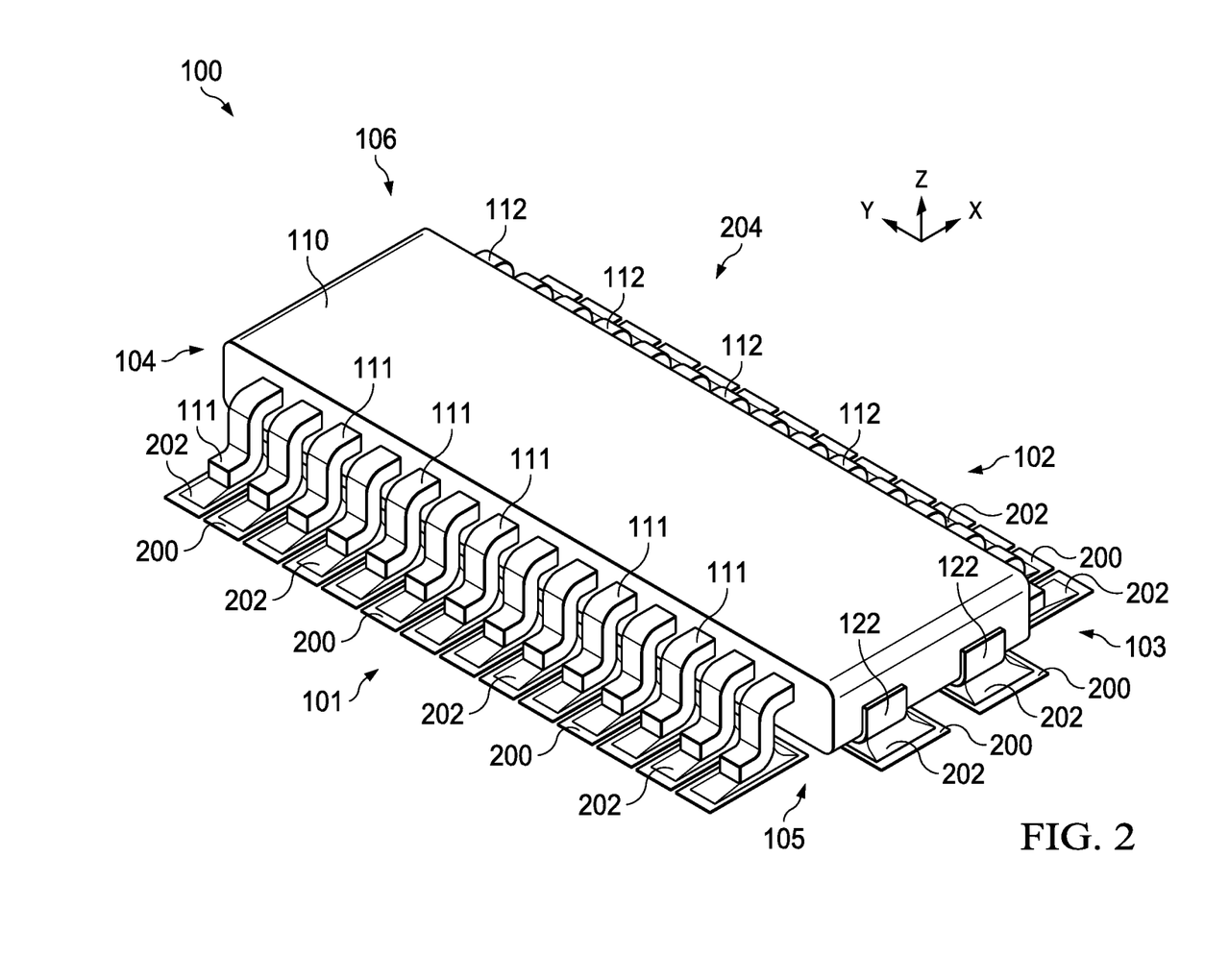
FIG. 2 is a top perspective view of the electronic device of FIG. 1.

FIGS. 1 and 2 show respective bottom and top perspective views of an example electronic device 100 with six sides 101-106 defined by a package structure 110. The device 100 in one example is an integrated circuit including multiple electronic components at least partially enclosed or encapsulated by the package structure 110. In another example, the device 100 can be a packaged electronic component, such as a sensor. The package structure 110 can be any suitable electrically insulating material, such as molded plastic, ceramic, etc. The illustrated example has a thin shrink small-outline package (TSSOP) shape, but other shapes and form factors can be used in other implementations.

The package structure 110 has an elongated rectangular shape with opposite first and second sides 101 and 102, respectively. The sides 101 and 102 are spaced apart from one another along a first direction (e.g., the X direction in the drawings). The package structure 110 also includes opposite third and fourth sides 103 and 104, respectively. The third and fourth sides 103 and 104 are spaced apart from one another along a second direction (e.g., the Y direction in the drawings) where the second direction Y is orthogonal to the first direction X. The package structure 110 also includes opposite fifth (e.g., bottom) and sixth (e.g., top) sides 105 and 106, respectively. The fifth and sixth sides 105 and 106 are spaced apart from one another along a third direction (e.g., the Z direction in the drawings). The third direction is orthogonal to the first and second directions X and Y (e.g., the respective first, second, and third directions X, Y and Z are orthogonal to one another). In one example, the fifth side 105 is planar to provide a flat bottom side, although not a requirement of all possible implementations. The respective first, second, third, and fourth sides 101-104 in one example include upper and lower beveled portions adjacent to the respective bottom and top (e.g., fifth and sixth) sides 105 and 106, although not a requirement of all possible implementations.

The elongated first and second sides 101 and 102, respectively, have associated leads. The leads in this example include a set of first leads 111 that extend outward from the first side 101, and a set of second leads 112 that extend outward from the opposite second side 102. The respective ones of the first leads 111 extend outward from the first side 101 along the first direction X, and the respective ones of the second leads 112 extend outward from the second side 102 along the first direction X. Within each set, the leads 111, 112 are spaced from one another along the second direction Y, for example, in a uniform lead pitch pattern, although uniform spacing and uniform lead shapes are not required for all possible implementations.

In one example, the leads 111 and 112 are formed into gull wing shapes as seen in FIGS. 1 and 2. In this example, the individual first and second leads 111 and 112 include a first portion that extends outward from the respective one of the first and second sides 101 and 102, along with a second portion that extends from the first portion toward a plane of the fifth side 105 (e.g., the X-Y plane in the drawings) and away from a plane of the fourth side 104, and a third portion that extends from the second portion. The respective third portions of the leads 111 and 112 include a surface that is spaced apart from and beyond the plane of the fifth side 105 to allow soldering to a host printed circuit board, for example, as shown in FIG. 2. Other shapes can be formed in other implementations, such as J leads, etc.

Figure 6:
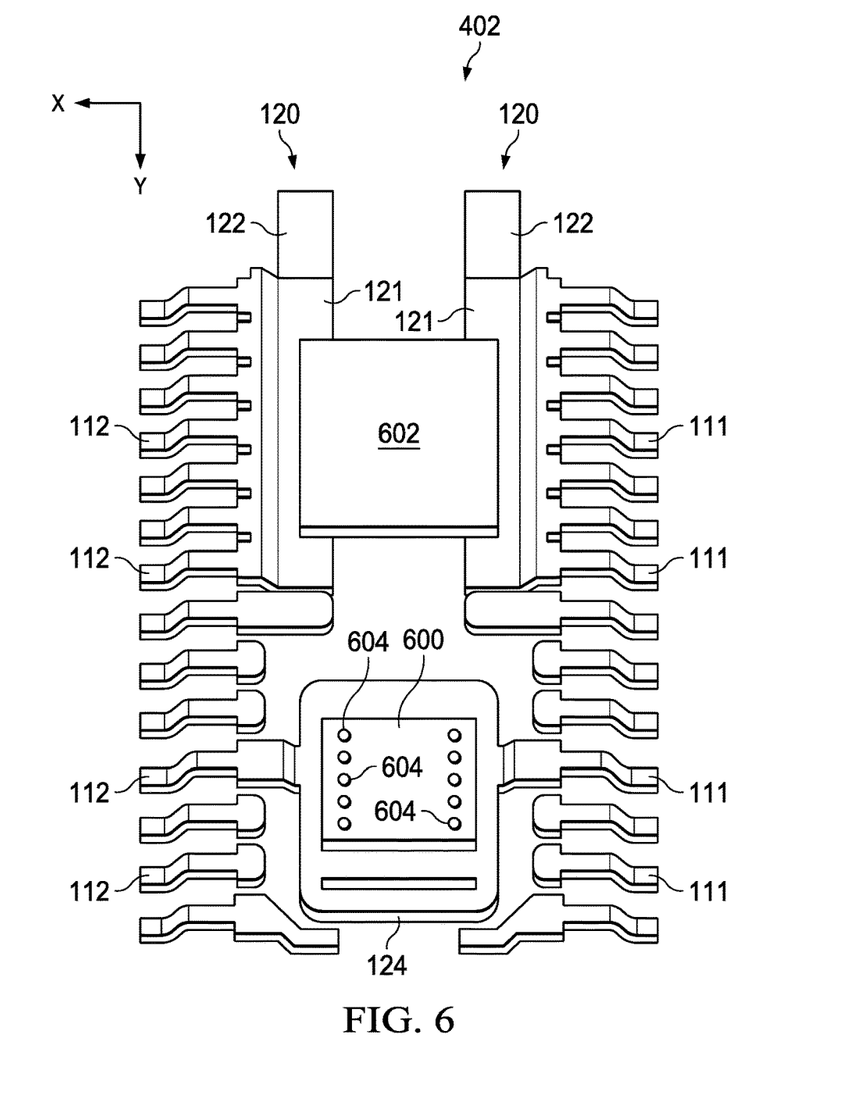
FIG. 6 is a partial top perspective view of a portion of the lead frame of FIGS. 4 and 5 with a semiconductor die attached to a die attach pad and a shunt component attached to the three dimensional thermal pads.
Figure 7:
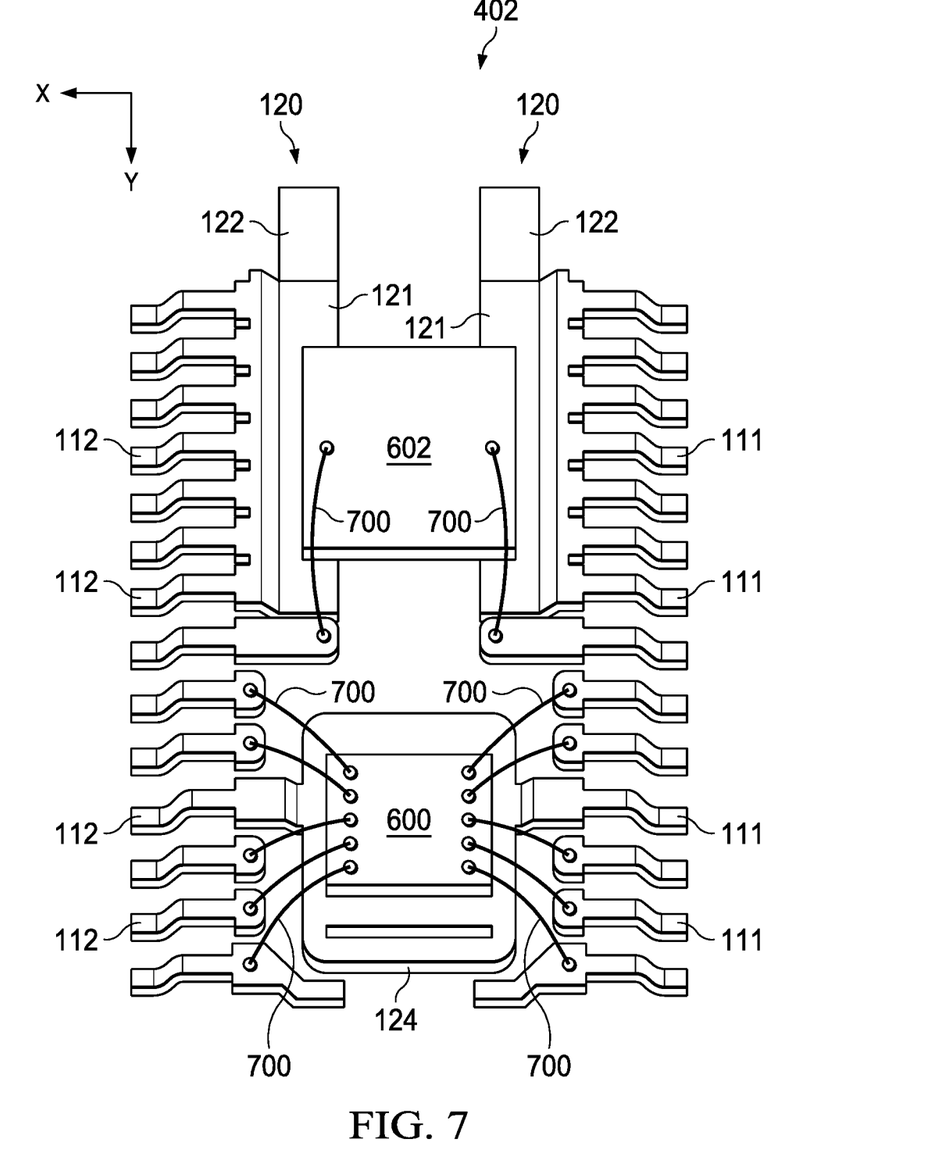
FIG. 7 is a partial top perspective view of a portion of the lead frame of FIGS. 4-6 with bond wires soldered between first and second leads of the lead frame, the semiconductor die, and the shunt component.

In one example, the electronic device 100 includes sensor circuitry, with a semiconductor die and a low temperature coefficient sensor shunt (e.g., FIGS. 6 and 7 below). FIG. 1 shows the bottom of the electronic device 100, which includes two, three dimensional, thermal pads 120. In one example, the thermal pads 120 are or include thermally and electrically conductive material, such as copper, aluminum, etc. In other implementations, a single three dimensional thermal pad can be used, or more than three generally three-dimensional thermal pads 120 can be provided. In the example of FIGS. 1 and 2, two spaced apart portions of a shunt (not shown in FIG. 1) are internally soldered or otherwise connected to enclosed portions of the respective thermal pads 120, for example, as shown below in FIGS. 6 and 7. The individual thermal pads 120 each include a first portion 121 that extends generally parallel to the second direction Y along a portion of the fifth side 105. The individual first portions 121 include an exposed side or surface that can be soldered to a host printed circuit board. In addition, the thermal pads 120 each include a second portion 122 that extends along a portion of the third side 103 from an end of the first portion 121, at a non-zero angle away from the plane of the third side 103 (e.g., away from the X-Y plane, at least partially in the third direction Z).

In the example of FIGS. 1 and 2, the angle of the second portions 122 generally corresponds to the angle of the lower beveled portion of the third side 103, although not a strict requirement of all possible implementations. Although the example second portions 122 of the thermal pads 120 are generally linear (e.g., straight), other implementations are possible in which the second portions 122 are curvilinear or piecewise linear, or combinations thereof. The combination of the respective first and second portions 121 and 122 provides a three-dimensional (e.g., 3-D) thermal pad structure 120, in which the respective first and second portions 121 and 122 are non-coplanar with respect to one another.

The example electronic device 100 in FIGS. 1 and 2 also includes a die attach pad 124. A bottom portion of the die attach pad 124 is exposed along the fifth side 105. In one implementation, a semiconductor die (e.g., FIGS. 6 and 7 below) is soldered or otherwise attached to an internal portion of the die attach pad 124. In addition, bond pads of the semiconductor die are wire bonded for electrical connection to corresponding ones of the leads 111 and/or 112 internal to the package structure 110 in this example. The die attach pad 124 can be any suitable thermally and electrically conductive material, such as copper, aluminum, etc.

The exposed sides or surfaces of the thermal pads 120 and the die attach pad 124 can be generally planar as shown or can have a contoured surface. In the illustrated example, the exposed bottom sides or surfaces of the first portions 121 of the thermal pads 120, and of the die attach pad 124 are coplanar with the generally planar bottom fifth surface 105, although not a requirement of all possible implementations. Coplanarity of the exposed portions of the thermal pads 120 and the die attach pad 124 facilitate solder ability of these features to corresponding conductive pads of a host PCB. Good solder connection, moreover, facilitates thermal transfer to remove heat from a semiconductor die attached to the die attach pad 124 and/or from a shunt component attached to one or both of the thermal pads 120. In addition, the extension of the thermal pads 120 by the inclusion of the additional second portions 122 provides enlarged heat transfer area of the thermal pads 120 and facilitates heat transfer outward from the third side 103 of the electronic device 100, in addition to downward heat transfer out of the first portions 121.

FIG. 2 shows an example application with the electronic device 100 mounted on a host PCB. In this example, the bottom surfaces of the gullwing leads 111 and 112 are soldered to corresponding conductive pads 200 using solder 202. In addition, the exposed bottom side or surface of the die attach pad 124 and the underlying first portions 121 of the thermal pads 120 are soldered to corresponding conductive pads (not shown) on a top surface of a printed circuit board 204. The solder joints also mechanically mount the electronic device 100 to the PCB 204.

The extension of the thermal pads 120 upward from the surface of the host PCB 204 at least partially along a portion of the third side 103 allows corresponding extension of a conductive pad on the host PCB such that the solder joint between the second portions 122 and the conductive pad of the host PCB is visible, for example, to facilitate use of optical inspection cameras during manufacturing. This facilitates manufacturing processes that can quickly identify the quality of the solder connections of the thermal pads 120 with the host PCB, and also provides information that may correlate with solder joint quality of the die attach pad 124 to the host PCB. In other possible implementations, three-dimensional thermal pads can be provided on a different side and/or on more than one lateral side 101-104, including one or both of the sides 101, 102 that also include leads 111 or 112. The three-dimensional thermal pads 120 also enhance or facilitate additional heat removal, for example, by lateral heat dissipation through the second portions 122 of the thermal pads 120 to the ambient environment along at least a portion of the third side 103, in addition to the downward heat transfer through the first portions 121 to the underlying host PCB 204.

The described electronic device 100 provides a visually observable, solderable three-dimensional thermal pad 120 that can be soldered to the PCB 204 to facilitate proper thermal performance of the device 100 and allow solder inspection by camera from side view. The example solution facilitates more visible wetting of the side 103 or portions thereof for optical inspection of the solder joint quality. The example device 100 also mitigates or avoids the need for x-ray inspection of manufactured PCBs during fabrication to ensure adequate soldering, thereby reducing manufacturing cost and processing time.

Figure 3:
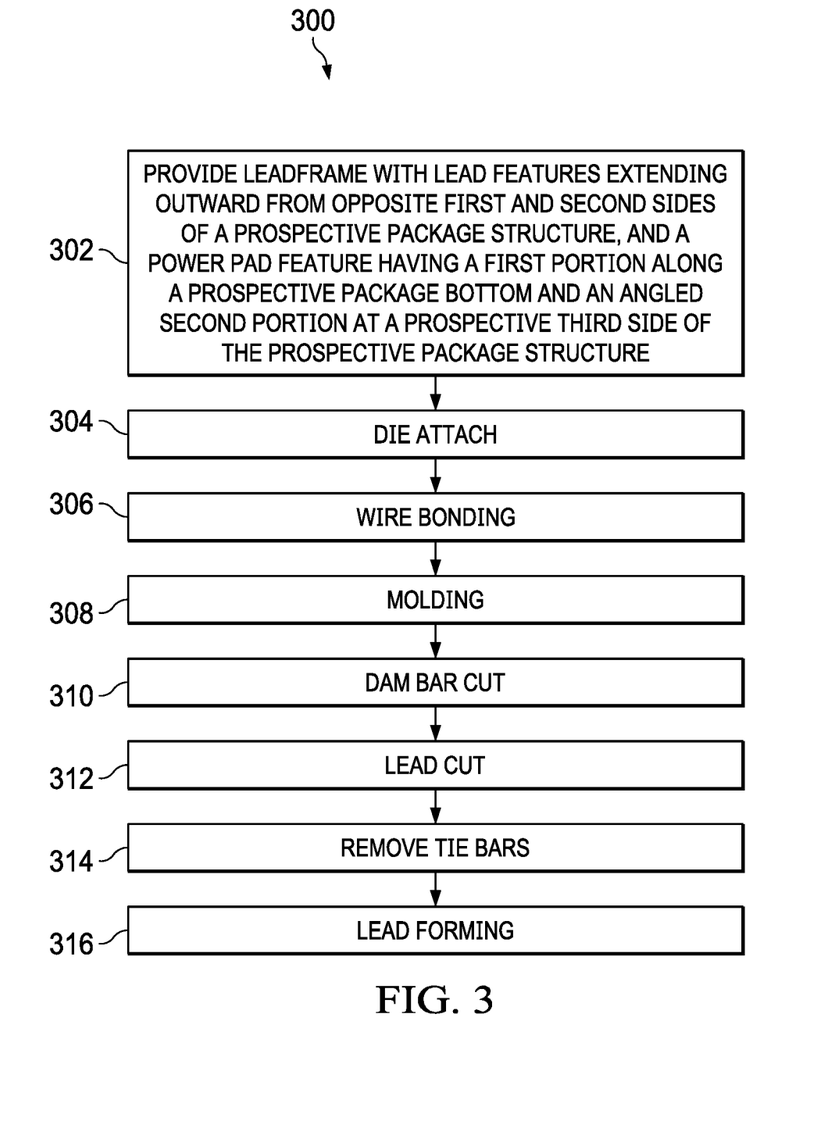
FIG. 3 is a flow diagram of a method of packaging an electronic device.
Figure 4:
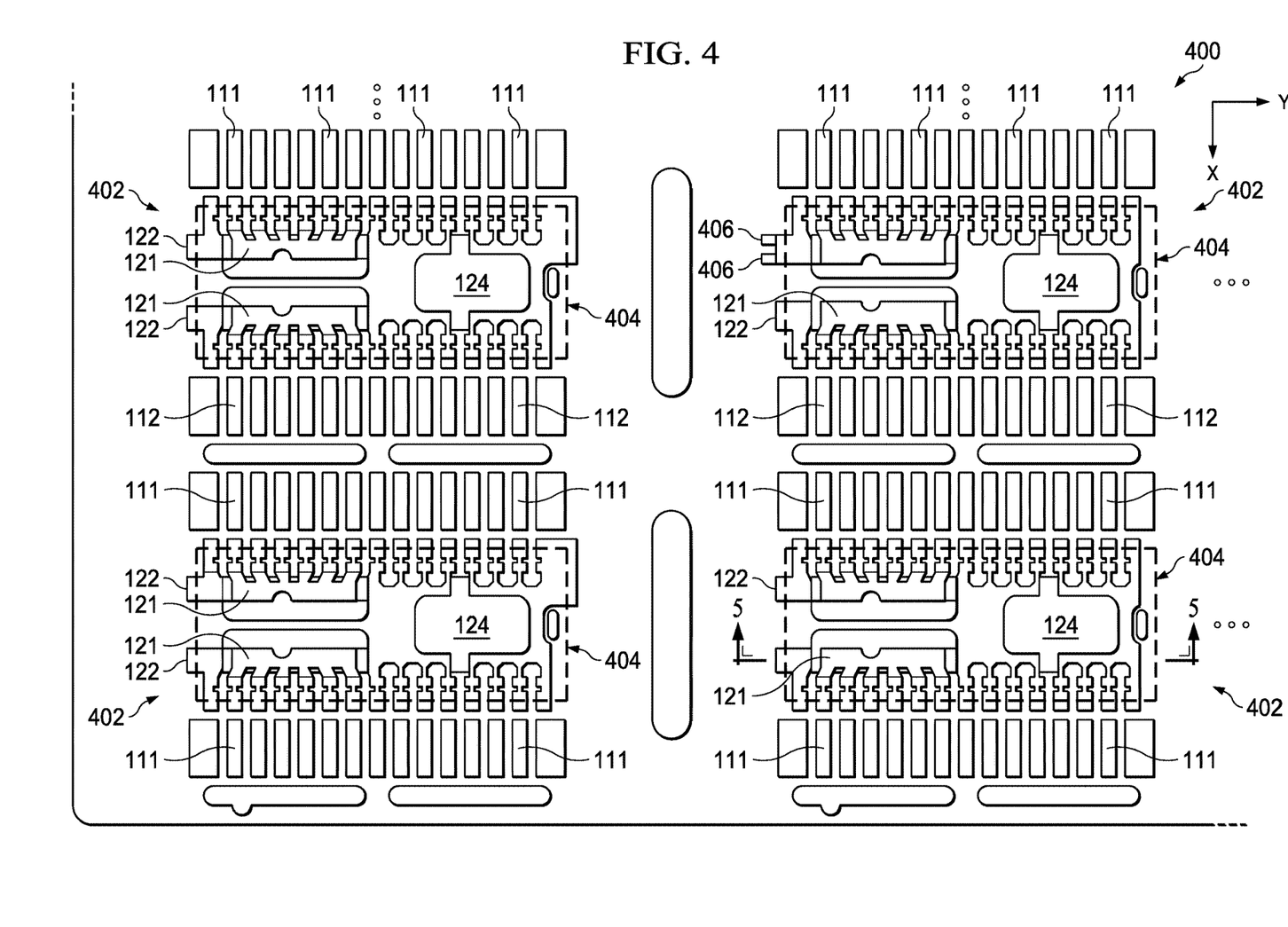
FIG. 4 is a partial top plan view of a lead frame with three dimensional thermal pads.
Figure 5:
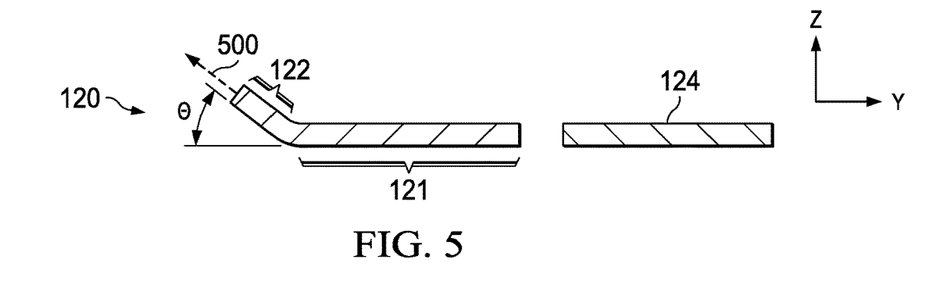
FIG. 5 is a partial sectional side elevation view of a portion of the lead frame taken along line 5-5 in FIG. 4.

Referring also to FIGS. 3-11, FIG. 3 shows an example method 300 for fabricating a packaged electronic device. FIGS. 4-11 illustrate a novel lead frame and use thereof in fabricating the example packaged electronic device 100 of FIGS. 1 and 2 according to the method 300. The method 300 begins at 302 in FIG. 3, including providing a lead frame 400 that has a set of first leads 111, a set of second leads 112, and a thermal pad 120, for example, as shown in FIGS. 1 and 2 above. FIGS. 4 and 5 show a portion of an example lead frame 400 that can be used at 302 in the method 300 of FIG. 3. The lead frame 400 includes multiple segments or portions 402, each of which correspond to a prospective finished packaged electronic device 100 at the end of the method 300. The illustration in FIG. 4 also indicates prospective molded plastic package structure boundaries 404 corresponding to the lateral sides 101-104 of the example packaged electronic device 100 shown in FIGS. 1 and 2.

FIG. 4 shows four example segments 402 of the example lead frame 400, and FIG. 5 shows a partial sectional side elevation view taken along line 5-5 of portions of the die attach pad 124 and the three-dimensional thermal pad 120 in one of the lead frame segments 402 in FIG. 4. The lead frame 400 can be made from any suitable electrically conductive material, such as aluminum, copper, etc. Each individual segment 402 of the lead frame 400 in this example includes a set of the first leads 111 that extend along the first direction X, and a set of the second leads 112 spaced apart from the first leads 111 along the first direction X. Respective ones of the second leads 112 extend along the first direction X. The individual segments 402 also include the die attach pad 124 and two thermal pads 120 that are spaced apart from the first leads 111 and are also spaced apart from the second leads 112. In the example of FIG. 4, the second portion 122 of each of the thermal pads 120 is located between the set of the first leads 111 and the set of the second leads 112 along the first direction X, although not a requirement of all possible implementations.

As further shown in FIG. 5, the second portion 122 of the individual thermal pads 120 extends at a non-zero angle θ to the plane of the bottom of the lead frame (e.g., the X-Y plan of FIG. 4), such that the second portion 122 extends at the non-zero angle θ to the plane of the bottom fifth side 105 of the package structure 110 in FIGS. 1 and 2 when the electronic device 100 is completed. In one example, the non-zero angle θ is greater than 15 degrees and less than 90 degrees. In certain implementations, the electronic device 100 is substantially commensurate with a beveled portion of the associated final package side. For example, the lower beveled portion of the third side 103 in FIGS. 1 and 2 above extends at the non-zero angle θ to the plane of the fifth side 105. In one implementation, the angle θ between the first and second portions 121 and 122 of the thermal pad 120 of the lead frame 400 is set such that it corresponds to a mold angle of the beveled portion of the third side 103 of a mold used to form the package structure 110. The first portion 121 in the sectional view of FIG. 5 extends along the second direction Y. In addition, the first portion 121 is coplanar with the first and second leads 111, 112 in the X-Y plane. The second portion 122 of the three-dimensional thermal pad 120 extends from an end of the first portion 121 along a direction 500 at the non-zero angle θ to the X-Y plane. In this example, the first and second portions 121 and 122 of the thermal pad 120 are non-coplanar.

The example lead frame 400 in FIG. 4 also includes a small tie bar 406 connected to one or more of the thermal pad second portions 122, although not required for all possible implementations. In one example, the tie bar 406 is designed to connect with a main structure of the beginning lead frame 400 to maintain stability during fabrication and can later be removed during trimming and forming operations. The lead frame 400 in one example is a copper structure formed by suitable stamping operations, as well as bending or forming operations to provide a starting three-dimensional thermal pad structure 120 for each segment 402. In another possible implementation, the respective first and second portions 121 and 122 of the individual thermal pads 120 are initially coplanar in the starting lead frame 400. The second portions 122 in one example are subsequently bent or angled upward after molding, for example, during lead forming processing.

In one example, the lead frame 400 includes one or more support arms with structural features (not shown) that support the die attach pad 124 and the thermal pads 120. Such support arm or arms can be connected to portions of the lead frame to support these features during and after manufacturing or can be removed during manufacturing. In another example, the die attach pads 124 and/or the thermal pads 120 are supported relative to the lead frame 400 using an adhesive carrier or tape (not shown) during portions of the manufacturing process. Prior to external lead forming following packaging, the first and second leads 111 and 112 are generally planar as shown in FIG. 4. In another example, the leads 111 and 112 can be formed into going shapes in the initial lead frame 400. The first and second leads 111 and 112 in the original lead frame 400 include first portions (e.g., inner portions) that will be encapsulated or enclosed by the subsequently formed package structure 110.

The method 300 continues at 304 in FIG. 3, with attaching a semiconductor die to the die attach pad 124 of the lead frame 400. The die attachment at 304 can be performed using any suitable adhesive attachment materials, soldering, etc. FIG. 6 shows one example of the die attach processing at 304, in which a semiconductor die 600 is attached (e.g., soldered, glued, etc.) to a top surface of the die attach pad 124. In one example, the die attach processing at 304 also includes attaching a semiconductor die and/or one or more electrical components to the three-dimensional thermal pad 120. In the example of FIG. 6, a shunt component 602 is attached to the two example thermal pads 120 by gluing or soldering. In the illustrated example, moreover, the semiconductor die 600 includes conductive bond pads 604 that are electrically connected to internal circuit nodes (not shown) of the semiconductor die 600.

In one implementation, the shunt 602 is a low thermal coefficient resistor component that forms a shunt for sensing current in an associated host circuit (not shown). The shunt 602 in this example includes opposite ends connected to corresponding ones of the thermal pads 120 as shown in FIG. 6. The thermal heat removal advantages of the three-dimensional thermal pads 120 in this application help thermally stabilize the shunt component 602. In addition, the three-dimensional thermal pad 120 includes the second portion 121 soldered laterally outward of the third side 103 of the resulting electronic device 100 to facilitate automated (e.g., camera) manufacturing inspection of solder joint quality during a circuit board manufacturing process. Although the leads 111, 112 are shown as formed into non-planar gull wing shapes during die attach processing in FIG. 6, in another example, the leads 111, 112 are flat (e.g., planar) during the die attach processing at 304 in FIG. 3.

The method 300 continues at 306 in FIG. 3, with attaching one or more bond wires between respective bond pads 604 of the semiconductor die 600 and at least some of the first and second leads 111, 112 of the lead frame 400. FIG. 7 shows one example of the wire bonding processing at 306, in which bond wire 700 are soldered between corresponding bond pads 604 of the semiconductor die 600 and respective ones of the first and/or second leads 111, 112. Although the leads 111, 112 are shown as formed into non-planar gull wing shapes in FIG. 7, in another example, the leads 111, 112 are flat (e.g., planar) during the wire bonding processing at 306 in FIG. 3.

Figure 8:
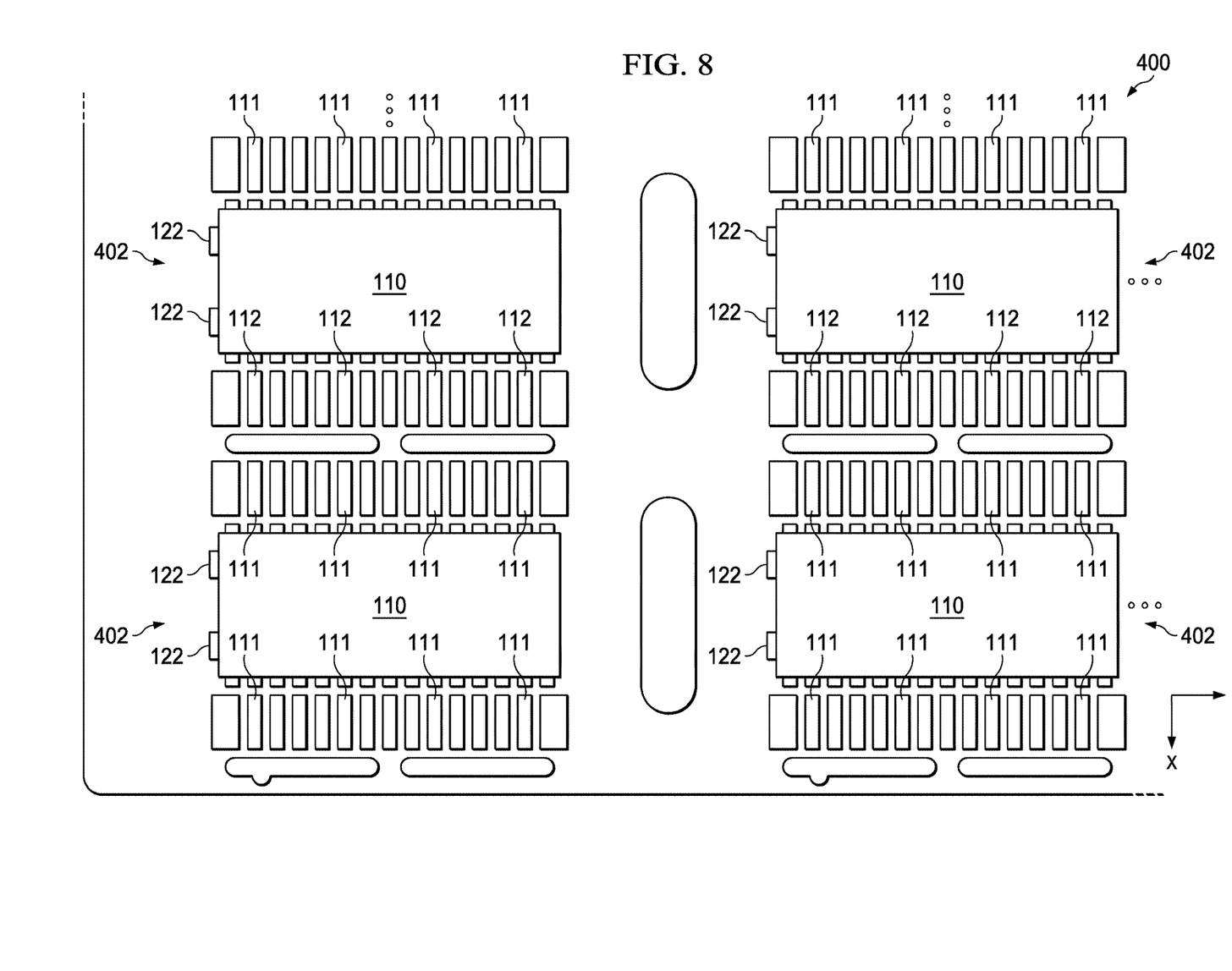
FIG. 8 is a partial top plan view of the lead frame after molding.

The method continues at 308 in FIG. 3, with molding or other packaging structure formation. FIG. 8 shows a top view of an example molding processing at 308, which includes injecting a molding material (e.g., molten plastic) into a mold (not shown) to enclose the semiconductor die 303, a portion of the die attach pad 124, portions of the first and second leads 111, 112, and parts of the first and second portions 121, 122 of the thermal pad 120. After molding, the remaining package structure 110 in this example exposes parts of the respective first and second portions 121 and 122 of the thermal pad 120.

Figure 9:
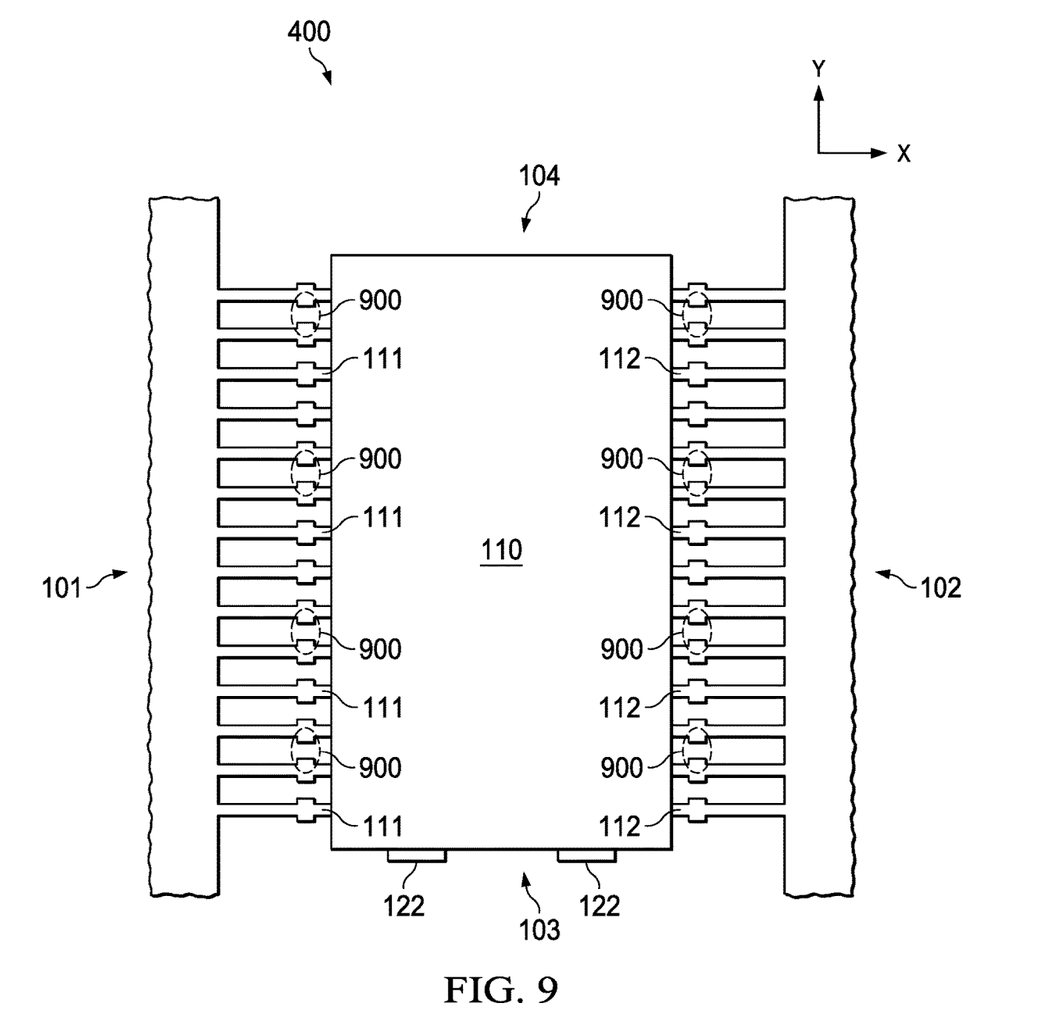
FIG. 9 is a partial top plan view of the lead frame after a damn bar.
Figure 10:
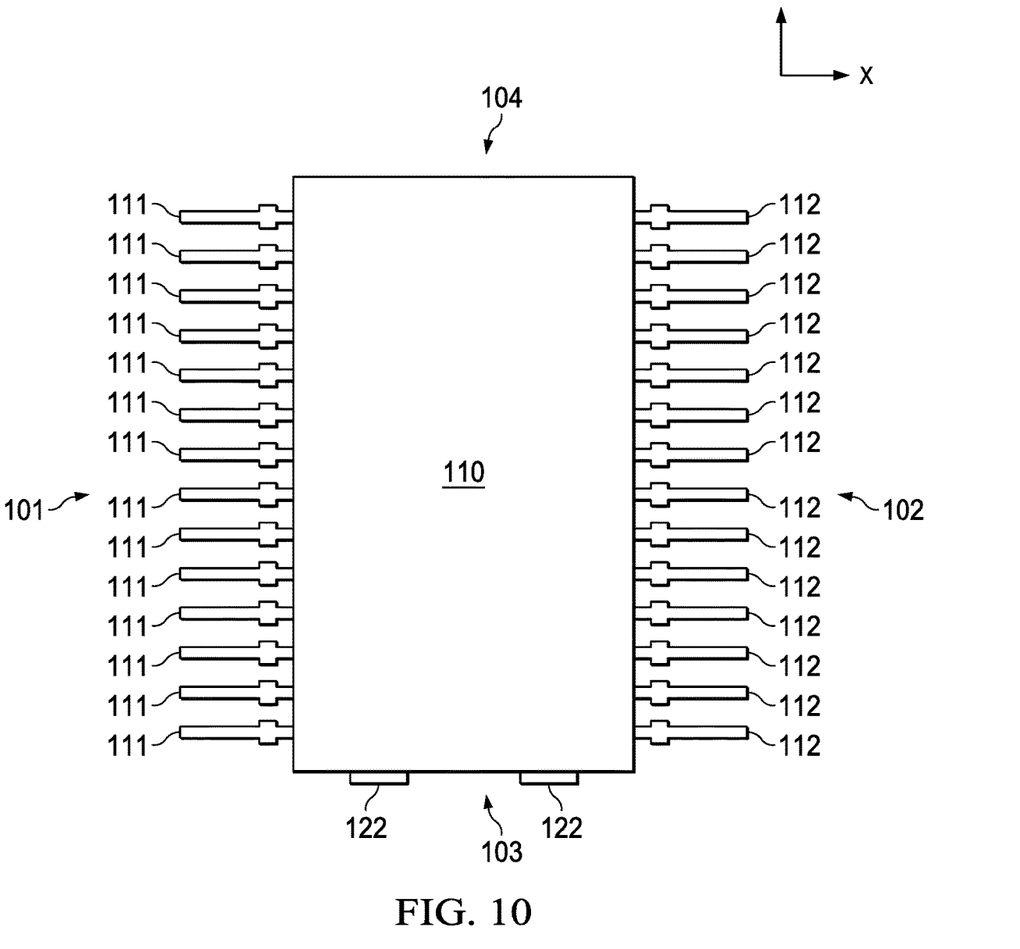
FIG. 10 is a partial top plan view of the lead frame after a lead trim process.
Figure 11:
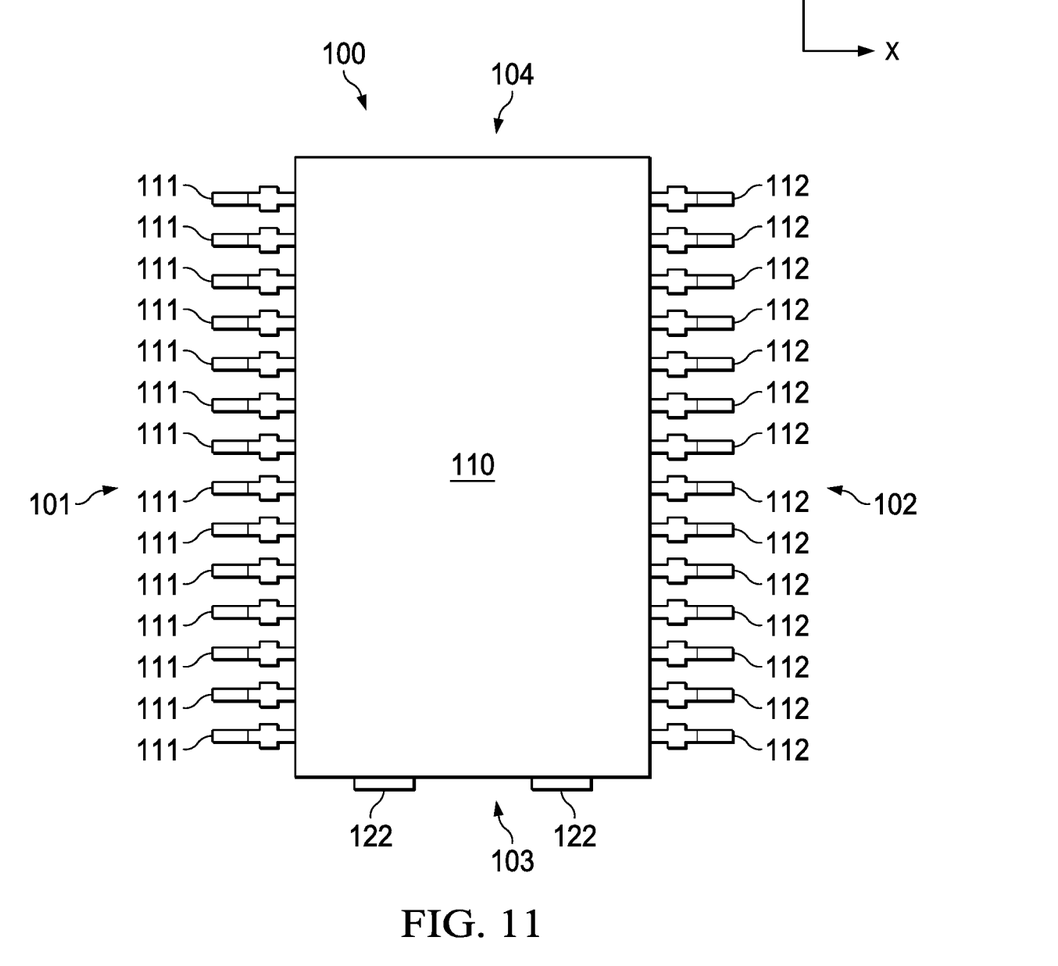
FIG. 11 is a partial top plan view of the electronic device after a lead forming process.

The method 300 continues at 310-316, with trimming and forming operations, including dam bar cutting at 310. FIG. 9 shows a single segment following a dam bar cut process at 310, which uses punch dies (not shown) to selectively remove dam bar portions between adjacent ones of the leads 111 and 112. FIG. 9 shows example circled areas 900 where dam bar portions have been removed by the processing at 310. Continuing at 312, the method 300 further includes lead trimming or cutting to trim ends of the respective first and second leads 111 and 112, followed by removal of separated tie bars at 314. FIG. 10 shows a single segment following lead trimming and tie bar removal to provide a final length for the first and second leads 111 and 112. The method 300 continues at 316, with lead forming. FIG. 11 shows a top view of the example electronic device 100 following a lead forming (e.g., bending) process, which forms parts of the exposed portions of the first and second leads 111 and 112 into gull wing shapes as also shown in FIGS. 1 and 2 above.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:

1. An electronic device, comprising:
a package structure, including a first side, a second side spaced apart from the first side along a first direction, a third side, a fourth side spaced apart from the third side along a second direction, a fifth side, and a sixth side spaced apart from the fifth side along a third direction, the first, second, and third directions being orthogonal to one another;
a set of first leads, respective ones of the first leads extending outward from the first side along the first direction;
a set of second leads, respective ones of the second leads extending outward from the second side along the first direction; and
a thermal pad, including a first portion extending along a portion of the fifth side, and a second portion extending along a portion of the third side from an end of the first portion.

2. The electronic device of claim 1,
wherein the first leads are gull wing leads, respective ones of the first leads including:
a first portion extending outward from the first side along the first direction,
a second portion extending from the first portion toward a plane of the fifth side and away from a plane of the fourth side, and
a third portion extending from the second portion, and including a surface spaced apart from and beyond the plane of the fifth side; and
wherein the second leads are gull wing leads, respective ones of the second leads including:
a first portion extending outward from the second side along the first direction,
a second portion extending from the first portion toward the plane of the fifth side and away from the plane of the fourth side, and
a third portion extending from the second portion, and including a surface spaced apart from and beyond the plane of the fifth side.

3. An electronic device, comprising:
a package structure, including a first side, a second side spaced apart from the first side along a first direction, a third side, a fourth side spaced apart from the third side along a second direction, a fifth side, and a sixth side spaced apart from the fifth side along a third direction, the first, second, and third directions being orthogonal to one another;
a set of first leads, respective ones of the first leads extending outward from the first side along the first direction, wherein the first leads are gull wing leads, respective ones of the first leads including:
a first portion extending outward from the first side along the first direction,
a second portion extending from the first portion toward a plane of the fifth side and away from a plane of the fourth side, and
a third portion extending from the second portion, and including a surface spaced apart from and beyond the plane of the fifth side;
a set of second leads, respective ones of the second leads extending outward from the second side along the first direction, wherein the second leads are gull wing leads, respective ones of the second leads including:

a first portion extending outward from the second side along the first direction, a second portion extending from the first portion toward the plane of the fifth side and away from the plane of the fourth side, and a third portion extending from the second portion, and including a surface spaced apart from and beyond the plane of the fifth side; and a thermal pad, including a first portion extending along a portion of the fifth side, and a second portion extending along a portion of the third side from an end of the first portion wherein the second portion of the thermal pad extends at a non-zero angle to the plane of the fifth side of the package structure, and wherein the non-zero angle is greater than 15 degrees and less than 90 degrees.

4. The electronic device of claim 3, wherein the third side of the package structure includes a beveled portion adjacent to the fifth side, and wherein the beveled portion of the third side of the package structure extends at the non-zero angle to the plane of the fifth side.

5. An electronic device, comprising:
a package structure, including a first side, a second side spaced apart from the first side along a first direction, a third side, a fourth side spaced apart from the third side along a second direction, a fifth side, and a sixth side spaced apart from the fifth side along a third direction, the first, second, and third directions being orthogonal to one another;

a set of first leads, respective ones of the first leads extending outward from the first side along the first direction, wherein the first leads are gull wing leads, respective ones of the first leads including:
a first portion extending outward from the first side along the first direction,
a second portion extending from the first portion toward a plane of the fifth side and away from a plane of the fourth side, and
a third portion extending from the second portion, and including a surface spaced apart from and beyond the plane of the fifth side;

a set of second leads, respective ones of the second leads extending outward from the second side along the first direction, wherein the second leads are gull wing leads, respective ones of the second leads including:
a first portion extending outward from the second side along the first direction,
a second portion extending from the first portion toward the plane of the fifth side and away from the plane of the fourth side, and
a third portion extending from the second portion, and including a surface spaced apart from and beyond the plane of the fifth side; and a thermal pad, including a first portion extending along a portion of the fifth side, and a second portion extending along a portion of the third side from an end of the first portion wherein the third side of the package structure includes a beveled portion adjacent to the fifth side, wherein the beveled portion of the third side of the package structure extends at a non-zero angle to the plane of the fifth side, and wherein the second portion of the thermal pad extends along at least a portion of the beveled portion of the third side of the package structure.

6. The electronic device of claim 2, wherein the fifth side is planar.

7. An electronic device, comprising:
a package structure, including a first side, a second side spaced apart from the first side along a first direction, a third side, a fourth side spaced apart from the third side along a second direction, a fifth side, and a sixth side spaced apart from the fifth side along a third direction, the first, second, and third directions being orthogonal to one another;

a set of first leads, respective ones of the first leads extending outward from the first side along the first direction;

a set of second leads, respective ones of the second leads extending outward from the second side along the first direction; and a thermal pad, including a first portion extending along a portion of the fifth side, and a second portion extending along a portion of the third side from an end of the first portion wherein the second portion of the thermal pad extends at a non-zero angle to a plane of the fifth side of the package structure, and wherein the non-zero angle is greater than 15 degrees and less than 90 degrees.

8. The electronic device of claim 7, wherein the third side of the package structure includes a beveled portion adjacent to the fifth side, and wherein the beveled portion of the third side of the package structure extends at the non-zero angle to the plane of the fifth side.

9. An electronic device, comprising:
a package structure, including a first side, a second side spaced apart from the first side along a first direction, a third side, a fourth side spaced apart from the third side along a second direction, a fifth side, and a sixth side spaced apart from the fifth side along a third direction, the first, second, and third directions being orthogonal to one another;

a set of first leads, respective ones of the first leads extending outward from the first side along the first direction;

a set of second leads, respective ones of the second leads extending outward from the second side along the first direction; and a thermal pad, including a first portion extending along a portion of the fifth side, and a second portion extending along a portion of the third side from an end of the first portion wherein the third side of the package structure includes a beveled portion adjacent to the fifth side, wherein the beveled portion of the third side of the package structure extends at a non-zero angle to the plane of the fifth side, and wherein the second portion of the thermal pad extends along at least a portion of the beveled portion of the third side of the package structure.

10. The electronic device of claim 1, wherein the fifth side is planar.

11. A lead frame, comprising:
a set of first leads, respective ones of the first leads extending along a first direction;

a set of second leads spaced apart from the first leads along the first direction, respective ones of the second leads extending along the first direction; and a thermal pad spaced apart from the first leads and from the second leads, the thermal pad including:
a first portion extending along a second direction, the second direction being orthogonal to the first direction, the first portion coplanar with the first and second leads in a plane of the first and second directions, and a second portion extending from an end of the first portion along a direction at a non-zero angle to the plane of the first and second directions.

12. The lead frame of claim 11, further comprising a die attach pad.

13. The lead frame of claim 12, wherein the second portion of the thermal pad is located between the set of the first leads and the set of the second leads.

14. The lead frame of claim 11, wherein the second portion of the thermal pad is located between the set of the first leads and the set of the second leads.

15. The lead frame of claim 11, wherein the non-zero angle is greater than 15 degrees and less than 90 degrees.

16. A method, comprising:
    providing a lead frame, having:
        a set of first leads, respective ones of the first leads extending along a first direction,
        a set of second leads spaced apart from the first leads along the first direction, respective ones of the second leads extending along the first direction, and
        a thermal pad spaced apart from the first leads and from the second leads, the thermal pad including:
            a first portion extending along a second direction orthogonal to the first direction, the first portion coplanar with the first and second leads, and
            a second portion extending from an end of the first portion along a direction at a non-zero angle to a plane of the first and second directions, and
        a die attach pad coplanar with the first portion and with the first and second leads;
    attaching a semiconductor die to the die attach pad of the lead frame;
    attaching bond wires between respective bond pads of the semiconductor die and at least some of the first and second leads of the lead frame; and
    enclosing the semiconductor die, a portion of the die attach pad, portions of the first and second leads, and parts of the first and second portions of the thermal pad, in a package structure that exposes parts of the first and second portions of the thermal pad.

17. The method of claim 16, further comprising:
    trimming ends of the first and second leads; and
    forming parts of the exposed portions of the first and second leads.

18. The method of claim 17, wherein forming parts of the exposed portions of the first and second leads includes forming the exposed portions of the first and second leads into gull wing leads.

19. The method of claim 17, wherein enclosing the semiconductor die includes performing a molding process that forms the package structure with: opposite first and second sides spaced apart from one another along the first direction, opposite third and fourth sides spaced apart from one another along the second direction, and opposite fifth and sixth sides spaced apart from one another along a third direction orthogonal to the first and second directions, the package structure enclosing: the semiconductor die, a portion of the die attach pad, portions of the first and second leads, and parts of the first and second portions of the thermal pad, the package structure exposing: portions of the first and second leads on respective ones of the first and second sides, part of the first portion of the thermal pad on the fifth side, and part of the second portion of the thermal pad on the third side.

20. The method of claim 16, wherein enclosing the semiconductor die includes performing a molding process that forms the package structure with: opposite first and second sides spaced apart from one another along the first direction, opposite third and fourth sides spaced apart from one another along the second direction, and opposite fifth and sixth sides spaced apart from one another along a third direction orthogonal to the first and second directions, the package structure enclosing: the semiconductor die, a portion of the die attach pad, portions of the first and second leads, and parts of the first and second portions of the thermal pad, the package structure exposing: portions of the first and second leads on respective ones of the first and second sides, part of the first portion of the thermal pad on the fifth side, and part of the second portion of the thermal pad on the third side.

21. The electronic device of claim 1, wherein the second portion extends along a portion of the first side from an end of the first portion at a non-zero angle away from the plane of the third side.

22. The electronic device of claim 21, wherein the angle of the second portion corresponds to beveled portion of the third side.

* * * * *